United States Patent
Saito

(10) Patent No.: US 9,577,167 B2
(45) Date of Patent: Feb. 21, 2017

(54) SEMICONDUCTOR LIGHT EMITTING DEVICE

(71) Applicant: STANLEY ELECTRIC CO., LTD., Meguro-ku, Tokyo (JP)

(72) Inventor: Tatsuma Saito, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/977,447

(22) Filed: Dec. 21, 2015

(65) Prior Publication Data
US 2016/0181488 A1    Jun. 23, 2016

(30) Foreign Application Priority Data
Dec. 22, 2014   (JP) .................. 2014-258489

(51) Int. Cl.
| | |
|---|---|
| H01L 29/88 | (2006.01) |
| H01L 29/861 | (2006.01) |
| H01L 33/60 | (2010.01) |
| H01L 33/62 | (2010.01) |
| H01L 33/48 | (2010.01) |

(52) U.S. Cl.
CPC .......... *H01L 33/60* (2013.01); *H01L 33/486* (2013.01); *H01L 33/62* (2013.01); *H01L 2933/0091* (2013.01)

(58) Field of Classification Search
CPC ............. H01L 21/02164; H01L 21/02332; H01L 21/02326; H01L 21/02392; H01L 33/0012; H01L 27/0814; H01L 29/66204; H01L 51/5218; H01L 51/4293; H01L 51/5268; H01L 51/5271
USPC ....... 257/79, 88, 9, 104, 127, 200, 201, 288, 257/290, 396, 431, 622, 780, E21.006, 257/E21.053, E21.126, E21.127, E21.267, 257/E21.278, E21.293, E21.352, E21.366, 257/99
See application file for complete search history.

(56) References Cited

U.S. PATENT DOCUMENTS

| | | | | |
|---|---|---|---|---|
| 6,797,990 B2* | 9/2004 | Udagawa | ................ | H01L 29/20 257/103 |
| 6,839,376 B2* | 1/2005 | Goto | ...................... | H01S 5/141 372/101 |
| 7,407,421 B2* | 8/2008 | Kidoguchi | .......... | H01S 5/02204 257/65 |

(Continued)

FOREIGN PATENT DOCUMENTS

JP         2013065726 A     4/2013

*Primary Examiner* — David Nhu
(74) *Attorney, Agent, or Firm* — Holtz, Holtz & Volek PC

(57) ABSTRACT

A semiconductor light emitting device including a plurality of light emitting elements can be miniaturized while enabling to emit light with high luminance. The semiconductor light emitting device can include a mounting substrate, and a plurality of semiconductor light emitting elements mounted on the mounting substrate side by side, each of the semiconductor light emitting elements having a semiconductor structure layer that can include a first semiconductor layer of a first conductivity type, an active layer, and a second semiconductor layer of a second conductivity type opposite to the first conductivity type, which are layered in that order. Each of the semiconductor light emitting elements can have a resonator constituted by end surfaces of the semiconductor structure layer opposite to each other, and also has a recessed portion recessed from the surface of the second semiconductor layer toward the active layer.

18 Claims, 8 Drawing Sheets

(56) References Cited

U.S. PATENT DOCUMENTS

| | | | | |
|---|---|---|---|---|
| 7,858,995 B2 * | 12/2010 | Nakagawa | ............... | H01L 33/16 257/89 |
| 8,018,134 B2 * | 9/2011 | Kidoguchi | ........... | H01S 5/02204 313/498 |
| 8,044,439 B2 * | 10/2011 | Sakamoto | ............. | H01L 33/145 257/228 |
| 2014/0191258 A1 | 7/2014 | Akimoto et al. | | |

* cited by examiner

SEMICONDUCTOR LIGHT EMITTING DEVICE

This application claims the priority benefit under 35 U.S.C. §119 of Japanese Patent Application No. 2014-258489 filed on Dec. 22, 2014, which is hereby incorporated in its entirety by reference.

TECHNICAL FIELD

The present invention relates to a semiconductor light emitting device that can use a plurality of semiconductor light emitting elements.

BACKGROUND ART

General semiconductor light emitting elements can include a growth substrate; a semiconductor structure layer formed on the growth substrate and including an n-type semiconductor layer, an active layer, and a p-type semiconductor layer; and an n electrode and a p electrode configured to apply a voltage to the n-type semiconductor layer and the p-type semiconductor layer, respectively. Furthermore, there has been known a semiconductor light emitting element that improves its heat dissipation performance. Specifically, in the semiconductor light emitting element, a semiconductor structure layer is bonded to a support substrate different from a growth substrate, and after that the growth substrate is removed to complete the semiconductor light emitting element. Then, the resulting semiconductor light emitting elements can be secured to a mounting substrate and a phosphor layer for wavelength converting light can be formed thereon. The resulting product can be sealed with a resin to complete a semiconductor light emitting device. Japanese Patent Application Laid-Open No. 2013-065726 (or US 2014/191258A1 corresponding to this Japanese publication) discloses a semiconductor light emitting device which has a plurality of chips in a packaging structure and in which some of chips are connected in parallel.

Semiconductor light emitting devices have been widely used as a light source for high-intensity illumination such as for an automobile headlight, a projector, etc. Many of such semiconductor light emitting devices can have a structure in which a plurality of light emitting elements are arranged.

Furthermore, attention has been attracted on a technology for an automobile headlight to control the light distribution shape in real time depending on the situation ahead, specifically, the presence and the positions of oncoming vehicles, preceding vehicles, and the like. With this technology, it would be possible to control the light distribution shape by the automobile headlight, for example, to eliminate the irradiated area where an oncoming vehicle is present from the area irradiated with light from the headlight in real time when the oncoming vehicle is detected during its driving with a high-beam light distribution. This technology can provide a wider field of view to a driver just like when a high beam light distribution is used while it can prevent a glare beam to the oncoming vehicle. This type of light-distribution variable headlight system can be achieved by preparing a semiconductor light emitting device including a plurality of semiconductor light emitting elements arranged in an array shape, and controlling the respective semiconductor light emitting elements to be turned ON/OFF in real time.

When, however, such a light emitting device including a plurality of light emitting elements arranged side by side is produced, the size of the device may increase by the number of the light emitting elements in general. Furthermore, when the size of the light emitting element is decreased in consideration of the size of the light emitting device, the luminance of light emitted from a single element may be decreased to give insufficient amount of light. These disadvantages may hinder the achievement of a high-definition light distribution pattern by a vehicle headlight as described above.

SUMMARY

The present invention was devised in view of these and other problems and features in association with the conventional art. According to an aspect of the present invention, a semiconductor light emitting device including a plurality of light emitting elements can be miniaturized while enabling to emit light with high luminance.

According to another aspect of the present invention, a semiconductor light emitting device can include a mounting substrate, and a plurality of semiconductor light emitting elements mounted on the mounting substrate side by side, each of the semiconductor light emitting elements having a semiconductor structure layer that can include a first semiconductor layer of a first conductivity type, an active layer, and a second semiconductor layer of a second conductivity type opposite to the first conductivity type, which are layered in that order. Each of the semiconductor light emitting elements can have a resonator constituted by end surfaces of the semiconductor structure layer opposite to each other, and also has a recessed portion recessed from the surface of the second semiconductor layer toward the active layer.

With this configuration, the recessed portion can cause the light to be extracted as scattered light in a direction perpendicular to the semiconductor structure layer. This configuration can thus eliminate the need of consideration of end surface damage due to COD, thereby facilitating the provision of a predetermined amount of light intensity in a stable manner.

According to another aspect of the present invention, the semiconductor light emitting device according to the aforementioned aspect can be configured to include an individual conducting wire for each of the plurality of semiconductor light emitting element, connected to each of the first semiconductor layers.

With this configuration, the plurality of semiconductor light emitting elements can be independently controlled to be turned on or off.

According to another aspect of the present invention, the semiconductor light emitting device according to any one of the aforementioned aspects can be configured such that the recessed portion can have a bottom portion where a light scattering structure is provided.

With this configuration, the scattering of the resonance light at the bottom portion of the recessed portion can be promoted, thereby enabling to obtain a more amount of the scattered light from the recessed portion.

According to another aspect of the present invention, the semiconductor light emitting device according to any one of the aforementioned aspects can be configured such that the end surfaces of the semiconductor structure layer opposite to each other are each provided with a reflecting mirror. In this case, the reflecting mirror comprises an optical multilayered film formed on each of the end surfaces opposite to each other or comprises an optical multilayered film formed on each of the end surfaces opposite to each other, and a reflecting metal film formed on the optical multilayered film.

With this configuration, the reflectance at the paired end surfaces can be made almost 100%, and the output decrease of light extracted from the recessed portion (the scattered light) can be suppressed. This can almost perfectly prevent the light from being directed from the paired end surfaces to adjacent light emitting elements, and can suppress the occurrence of crosstalk of light.

According to another aspect of the present invention, the semiconductor light emitting device according to any one of the aforementioned aspects can be configured such that the light scattering structure can include phosphor particles provided at the bottom portion of the recessed portion.

With this configuration, the wavelength of the original scattered light can be appropriately designed by selection of the semiconductor materials used for production of the light emitting element of the device. The wavelength of fluorescent light can be appropriately designed by selection of the fluorescent material of the phosphor particles. Accordingly, desired hue of light to be emitted outside can be designed and obtained by the selection of the semiconductor materials and the fluorescent material.

BRIEF DESCRIPTION OF DRAWINGS

These and other characteristics, features, and advantages of the present invention will become clear from the following description with reference to the accompanying drawings, wherein.

DESCRIPTION OF EXEMPLARY EMBODIMENTS

Figure 1:
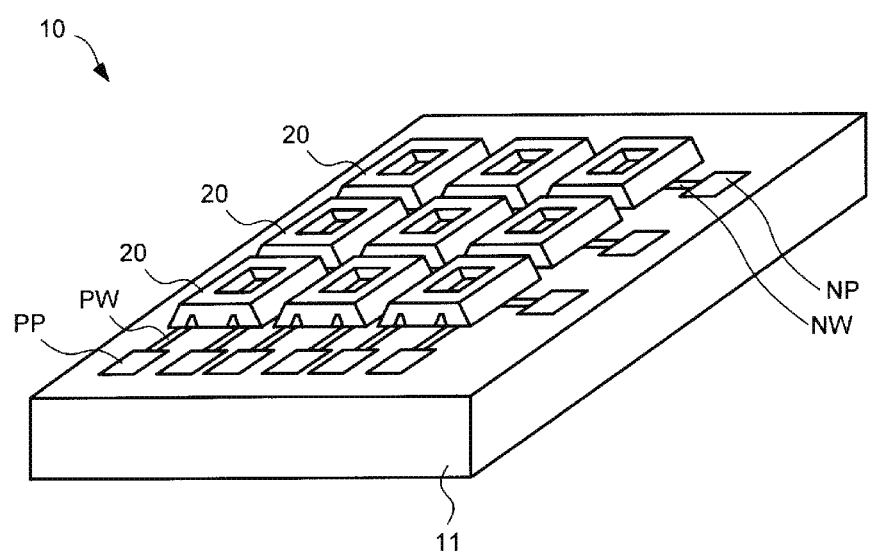
FIG. 1 is a schematic perspective view illustrating a semiconductor light emitting device made in accordance with principles of the present invention as a first exemplary embodiment.

A description will now be made below to a semiconductor light emitting device of the present invention with reference to the accompanying drawings in accordance with exemplary embodiments.[Example 1] FIG. 1 is a schematic perspective view illustrating a semiconductor light emitting device made in accordance with the principles of the present invention as a first exemplary embodiment. (Hereinafter, the semiconductor light emitting device may simply be referred to as a "device.") The semiconductor light emitting device 10 can include a structure made up of a plurality of semiconductor light emitting elements 20 (hereinafter, may simply be referred to as an "element") mounted on a mounting substrate 11 and arranged side by side in a matrix shape (array shape). In this exemplary embodiment, a description will be given of a case where each of the semiconductor light emitting elements 20 has a rectangular shape when viewed from a direction perpendicular to the mounting substrate 11, and the light emitting elements 20 are arranged in 3 lines by 3 rows.

In the semiconductor light emitting device 10, n-side pads NP and p-side pads PP can be formed on the substrate as a power terminal used when applying a voltage to each of the elements 20. Specifically, the p-side pads PP can be connected to the respective elements 20 via p-side conducting wires (first conducting wires) PW, and the n-side pads NP can be connected to the respective elements 20 via n-side conducting wires (second conducting wires) NW.

Figure 2A:
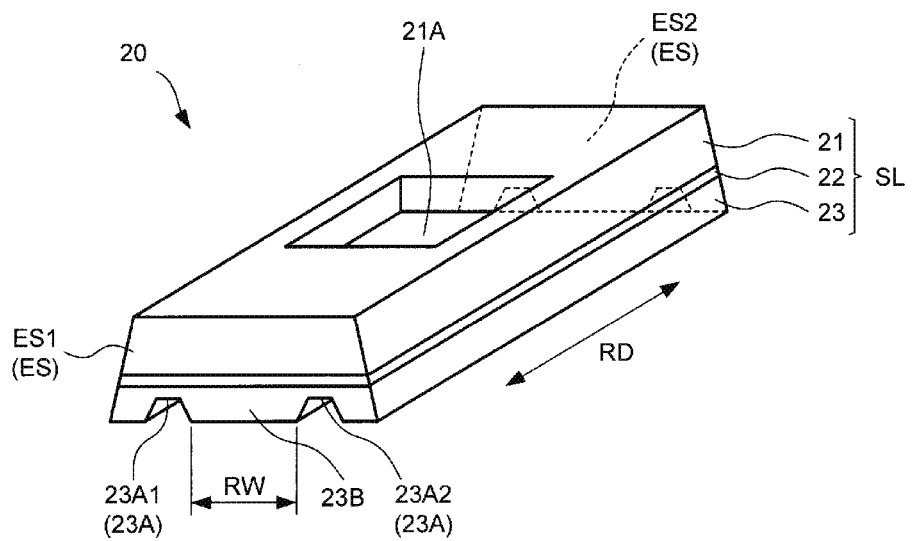
FIG. 2A is a perspective view illustrating a structure of a light emitting element included in the semiconductor light emitting device of the first exemplary embodiment.

FIG. 2A is a perspective view illustrating a structure of the semiconductor light emitting element 20. The semiconductor light emitting element 20 can have a semiconductor structure layer SL that can include a p-type semiconductor layer (a first semiconductor layer) 23, an active layer 22, and an n-type semiconductor layer (a semiconductor layer having an opposite conductivity to that of the first semiconductor layer, and referred to as a second semiconductor layer) 21. Each of the n-type semiconductor layer 21, the active layer 22, and the p-type semiconductor layer 23 can have a chemical composition of, for example, $Al_xIn_yGa_{1-x-y}N$ (here, $0 \leq x \leq 1$, and $0 \leq y \leq 1$). The semiconductor structure layer SL can be formed by sequentially stacking the p-type semiconductor layer 23, the active layer 22, and the n-type semiconductor layer 21 on the mounting substrate 11 in this order. Incidentally, this exemplary embodiment will be described as an example in which the semiconductor structure layer SL has a rectangular shape when viewed from a direction perpendicular to the semiconductor structure layer SL.

The semiconductor structure layer SL can have end surfaces ES opposite to each other to form a resonator therewith. Hereinafter the end surfaces ES may be referred to as a first end surface ES1 and a second end surface ES2 as appropriate. Furthermore, the opposite end faces ES may be referred to as an end face pair, as appropriate. In this exemplary embodiment, a case where the semiconductor structure layer SL can have a Fabry-Perot type resonator structure will be described. The light emitted from the active layer 22 can be repeatedly reflected by the first and second end surfaces ES1 and ES2 to be resonated in a resonance direction RD for amplification.

The semiconductor structure layer SL can have a recessed portion 21A that is concave from the surface of the n-type semiconductor layer 21 toward the active layer 22. The recessed portion 21A can have a bottom with a depth that does not reach the active layer 22. The recessed portion 21A can function as a light extraction portion of the semiconductor light emitting element 20. Therefore, the semiconductor light emitting element 20 can emit light from the recessed portion 21A in the direction perpendicular to the semiconductor structure layer SL. The recessed portion 21A can have a bottom surface parallel to the upper or lower surface of the semiconductor structure layer SL.

A pair of grooves (or sometimes referred to as paired grooves) 23A including a first groove 23A1 and a second groove 23A2 can be formed in the surface of the p-type semiconductor layer 23 of the semiconductor structure layer SL in the resonance direction RD thereof. Further the semiconductor structure layer SL can have a ridge portion 23B formed (defined) by the paired grooves 23A. The width of the resonator structure of the semiconductor structure layer SL can be defined by the ridge width RW of the ridge portion 23B. The recessed portion 21A and the paired grooves 23A can be formed by, for example, performing dry etching such as reactive ion etching on the n-type semiconductor layer 21 and the p-type semiconductor layer 23, respectively.

Figure 2B:
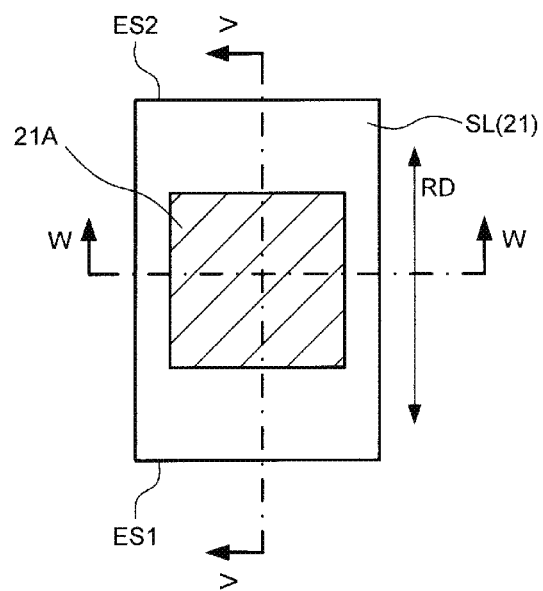
FIG. 2B is a top plan view of the same.

FIG. 2B is a top plan view of the semiconductor structure layer SL of the semiconductor light emitting element 20. As described above, each of the semiconductor light emitting elements 20 can include the recessed portion 21A in the n-type semiconductor layer 21 of the semiconductor structure layer SL as the light extraction portion. In this exemplary embodiment, the recessed portion 21A can have a length shorter than the distance between the first and second end surfaces ES1 and ES2 and a width smaller than the ridge width RW.

Figure 3A:
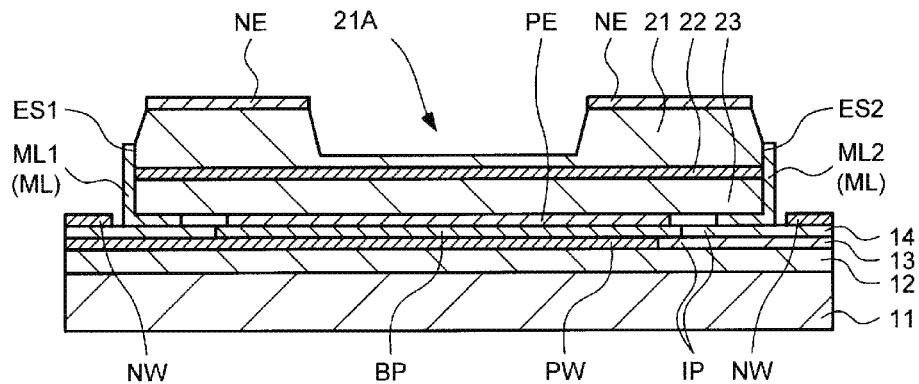
FIGS. 3A and 3B are each a cross-sectional view of the semiconductor light emitting device of the first exemplary embodiment.
Figure 3B:
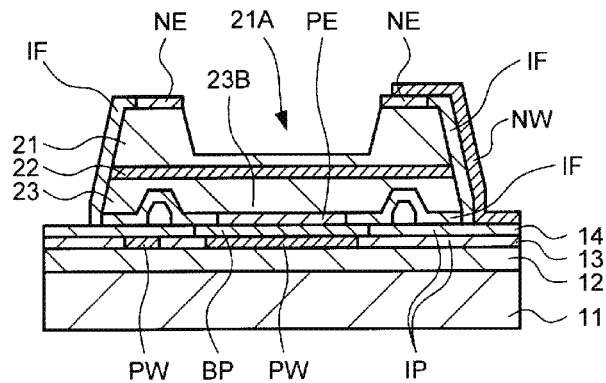

FIGS. 3A and 3B are each a cross-sectional view of the structure of the semiconductor light emitting element 20. Specifically, FIG. 3A is the cross-sectional view taken along line V-V in FIG. 2B, illustrating a cross section of the semiconductor light emitting element 20 in the resonance direction RD. Furthermore, a first reflecting mirror ML1 and a second reflecting mirror ML2 can be provided to the first end surface ES1 and the second end surface ES2 in the paired end surfaces ES of the semiconductor structure layer SL, respectively. Thus, the first and second reflecting mirrors ML1 and ML2 can constitute a pair of reflecting mirrors ML opposite to each other. As a result, in the semiconductor light emitting element 20, the resonator can be configured by the paired end surfaces ES and the paired reflecting mirrors ML provided to the respective end surfaces ES of the semiconductor structure layer SL.

On the opposite surfaces of the n-type semiconductor layer 21 and the p-type semiconductor layer 23, an n electrode (second electrode) NE and a p electrode (first electrode) PE can be formed, respectively. In this exemplary embodiment, the n electrode NE can be configured to surround the recessed portion 21A on the surface of the n-type semiconductor layer 21. The p electrode PE can be configured to be formed over the entire area of the p-type semiconductor layer 23 in the resonance direction RD. Desirably, the p electrode PE can be formed from a reflecting metal material such as Ag, Pt, Ni, Al, and Pd, or any alloy thereof. Furthermore, the p electrode PE can be formed from an ohmic contact material such as an In-containing transparent conductive oxide such as ITO or IZO. It should be noted that FIGS. 2A and 2B do not show the paired reflecting mirrors ML, the n electrode NE, and the p electrode PE for the sake of convenience.

The respective semiconductor light emitting elements can be arranged on the substrate 11 side by side. Specifically, an insulating layer 12 can be formed on the substrate 11. A p-side conducting wire layer 13 on which the p-side conducting wire PW is formed can be formed on the insulating layer 12. On the p-side conducting wire layer 12, a bonding layer 14 in which a bonding portion BP for bonding the element 20 onto the substrate 11 is formed can be formed. Therefore, the p-side conducting wire PW can be connected to the respective p electrodes PE (p-type semiconductor layers 23) of the elements 20 via the bonding portion BP. As a result, the element 20 can have a structure in which the p-type semiconductor layer 23, the active layer 22, and the n-type semiconductor layer 21 are sequentially layered on the substrate 11 in this order.

Incidentally, insulating portions IP can be formed on an area excluding an area where the p-side conducting wire PW is formed in the p-side conducting wire layer 13 and on an area excluding an area where the bonding portion BP is formed in the bonding layer 14. Furthermore, an n-side conducting wire NW can be formed on the insulating portion IP of the bonding layer 14 between the adjacent elements 20.

FIG. 3B is the cross-sectional view taken along line W-W in FIG. 2B. In this exemplary embodiment, FIG. 3B illustrates a cross section of the semiconductor light emitting element 20 in a direction perpendicular to the resonance direction RD in an in-plane direction of the semiconductor structure layer SL. In this exemplary embodiment, the p electrode PE can be formed on the surface of the p-type semiconductor layer 23 at the ridge portion 23B, i.e., between the first and second grooves 23A1 and 23A2. As a result, the p electrode PE can have a width same as the ridge width RW. As illustrated in FIG. 3B, insulating films IF can be formed on side surfaces of the semiconductor structure layer SL parallel to the resonance direction RD. Further an n-side conducting wire NW can be formed on the insulating film IF. Thus, the n-side conducting wire NW can electrically connect from the n-side pad NP to the n electrode NE through the side surface of the semiconductor structure layer SL of the element 20. Incidentally, insulating films IF can be formed on the inner walls of the first and second grooves 23A1 and 23A2.

The mounting substrate 11 can be formed from a high heat dissipation material made of Si, AlN, Mo, W, CuW, etc. The insulating layer 12, insulating portion IP, and the insulating film IF can be formed from an insulating material, such as $SiO_2$ or $Si_3N_4$. The n-side conducting wire NW and the p-side conducting wire PW can be formed from a metal material, such as Ti, Au, etc. The bonding portion BP and the p electrode PE, which are to be in contact with each other, can be formed from a combination of materials that are fused and bonded, such as Au and Sn, Au and In, Pd and In, Cu and Sn, Ag and Sn, Ag and In, and Ni and Sn or a combination of materials that are diffused and bonded, such as Au. The reflecting mirror ML can be formed from an optical multi-layered film using $TaO_2$ and/or $SiO_2$, for example.

Figure 3C:
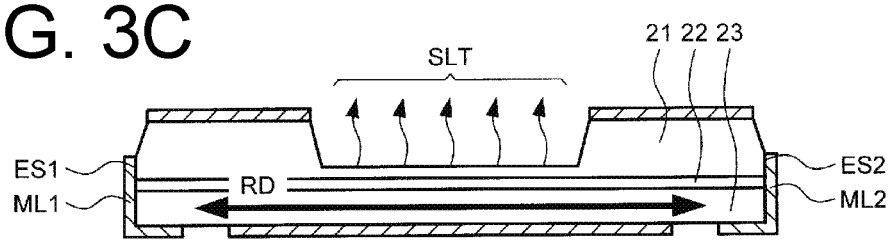
FIG. 3C is a schematic view illustrating how to take out the light from the element.

FIG. 3C is a schematic view illustrating how to take out the light from the recessed portion 21A in the semiconductor light emitting element 20. FIG. 3C shows a cross section same as FIG. 3A while part of hatching, constituent elements, and reference numerals are omitted from FIG. 3A. As illustrated in FIG. 3C, the light emitted from the active layer 22 can be caused to resonate (laser oscillate) between both the end surfaces of the semiconductor structure layer SL, i.e., between the reflecting mirrors ML1 and ML2 in the resonance direction RD in a steady state. The optical field in the semiconductor structure layer SL under the condition of resonance can have a strong intensity near the active layer 22, which attenuates with a distance farther away from the active layer 22. That is, the light may be concentrated at or near the active layer 22 under the condition of oscillation.

In this exemplary embodiment, the recessed portion 21A can be formed in the n-type semiconductor layer 21 and convex toward the active layer 22. Specifically, the recessed portion 21A can be formed toward the active layer 22 with the resonator structure to reach the inside of the n-type semiconductor layer 21. Therefore, the bottom of the recessed portion 21A can be formed within the n-type semiconductor layer 21 with a depth that does not reach the active layer 22. Appropriate setting of the depth of the recessed portion 21A toward the active layer 22 can facilitate the taking out of the light at the base portions of the optical field near the active layer 22. This may be because the evanescent field of the optical electric field can steep to the bottom of the recessed portion 21A with a distance closer to the active layer 22. Consequently, the light can be taken out from the bottom of the recessed portion 2A as scattered light SLT.

Specifically, the bottom surface of the recessed portion 21A can be formed not as an ideal flat surface but as a roughened surface by means of dry etching, etc. The thus formed bottom surface of the recessed portion 21A can change the refractive index with respect to the optical field. Accordingly, part of waveguide light that totally reflects at the bottom surface of the recessed portion 21A can be scattered in accordance with the surface roughness of the bottom surface of the recessed portion 21A. Then, the scattered light SLT can be taken out through the bottom surface of the recessed portion 21A. In this manner, the recessed portion 21A can cause the light to be extracted as scattered light SLT in the direction perpendicular to the semiconductor structure layer SL.

In a case of a general semiconductor laser, the reflectance of one of the end surfaces of the resonator is made slightly smaller to take out, through that end surface, light having been resonated and amplified. In this case, however, it is known that the increased driving current may damage the output end surface. This may be referred to as Catastrophic Optical Damage (COD), and the occurrence of COD may restrict the light extraction efficiency of such a general semiconductor laser. On the contrary, this exemplary embodiment can be configured such that the end surfaces ES1 and ES2 are made as a completely reflecting surface (the reflectance thereof is made as close as 100%) and the light is not taken out through the end surfaces of the resonator. This configuration can thus eliminate the need of consideration of end surface damage due to COD, thereby facilitating the provision of a predetermined amount of light intensity in a stable manner.

The extracted scattered light SLT may have certain coherence (have remaining coherence). Therefore, since the light extracted can have excellent directivity, the light extracted from the recessed portion 21A can be prevented from being directed to other element areas. This configuration can thus suppress the generation of crosstalk of light, i.e., the propagation of light to other element areas. Furthermore, the light is not taken out through the end surfaces of the resonator. Thus, the crosstalk of light to the adjacent elements 20 on the side of that element can be significantly prevented.

In a case of a general semiconductor laser, the direction in which the light is extracted is the same direction as the resonance direction. On the contrary, this exemplary embodiment can be configured such that the light extraction direction can be set to a direction perpendicular to the resonance direction RD, i.e., the direction perpendicular to the semiconductor structure layer SL. This configuration can achieve the surface light emission, and thus, the shape of light emission can be freely designed by the element itself. Since, the scattered light SLT extracted from the recessed portion 21A has high intensity, the element 20 can be utilized as a light source with high luminance. Thus, even if the size of each of the elements 20 arranged side by side is reduced, a desired amount of light and luminance can be provided, thereby remarkably reducing the size of the entire device 10. Alternatively, this configuration can increase the number of elements 20 arranged side by side without sacrificing the device size, thereby achieving high definition light distribution patterns.

Furthermore, in the case of a general semiconductor laser, laser oscillation can only be performed by application of a driving current higher than a certain threshold. Thus, such a general semiconductor laser must be applied with a current higher than the certain threshold to emit laser light. In this exemplary embodiment, however, since the size of the element 20 can be highly reduced, the threshold current value can be lowered. Consequently, when the driving current for the element 20 is compared with that for an element with a different structure (for example, simple light emitting diode) to provide the same light amount, the element 20 may require a smaller driving current than the element with a different structure. In this case, lowering of the driving current can be achieved, meaning that electric power saving can be achieved.

Furthermore, in this exemplary embodiment, since the light extraction portion can be formed in the main surface of the semiconductor structure layer SL, a heat sink can be formed on the substrate at an area closer to the main surface of the semiconductor structure layer SL. This configuration can facilitate the heat dissipation generated from the element. Thus, the device 10 can have an improved heat dissipation performance.

Incidentally, the elements can be arrayed by using a light emitting diode (LED) or a surface-emission type semiconductor laser. When such an LED or a surface-emission type semiconductor laser is used, the resulting device may not provide a sufficient output required for achieving a high luminance light source. According to the experiment performed by the inventor of this patent application, in which the end surface-emission type semiconductor lasers capable of providing high output were tried to be arrayed, the required optical system including light guiding members or optical fibers had been complicated. Thus, it was found that, when the miniaturization of a device is considered, the use of such end surface-emission type semiconductor lasers could not produce a compact arrayed light source with ease. On the contrary, the light emitting device 10 of the present invention can extract light from a portion that is not an end surface like the end surface-emission type semiconductor laser. Therefore, both the miniaturization and the arrayed element with improved high luminance can be achieved.

In this exemplary embodiment, a case where the reflecting mirrors ML1 and ML2 are provided to respective end surfaces of the semiconductor structure layer has been described. It is not necessary to provide paired reflecting mirrors ML to paired end surfaces ES.

Figure 4A:
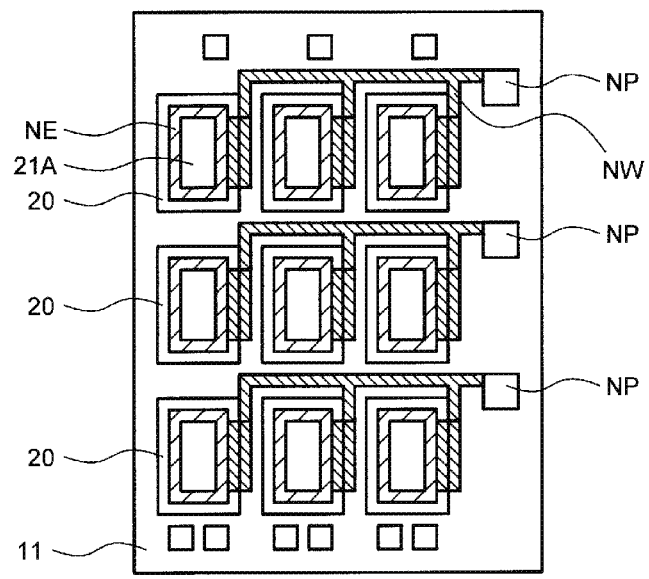
FIGS. 4A and 4B are each a diagram illustrating a conducting wire structure of the semiconductor light emitting device of the first exemplary embodiment.
Figure 4B:
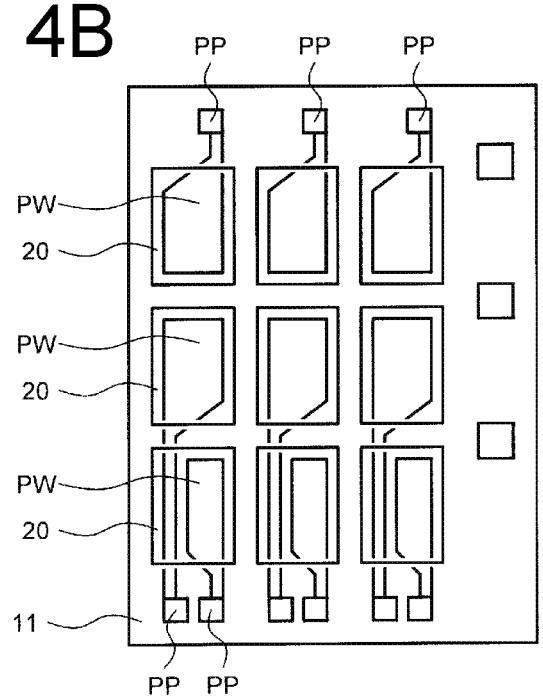

A description will now be given of an example of a conducting wire configuration of the device 10 with reference to FIGS. 4A and 4B. FIG. 4A is a top plan view schematically illustrating the configuration of the n-side conducting wires NW. In order to clarify the drawing, hatched are the areas where the n electrodes NE and the n-side conducting wires NW are formed. Each of the n-side conducting wires NW can be connected to each of the elements 20 in the same line out of the elements 20 arranged in a matrix shape. The n-side conducting wires NW can function as a common conducting wire connected to the respective n electrodes NE. FIG. 4B is a top plan view schematically illustrating the configuration of the p-side conducting wires PW. Each of the p-side conducting wires PW can be connected to each of the p electrode PE of each of the elements 20 between the element 20 and the substrate 11. The p-side conducting wires PW can function as an individual conducting wire connected to the p-type semiconductor layer 23 of each of the elements 20.

In the semiconductor light emitting device 10, the respective elements 20 can independently emit light. Specifically, the power supply control to the respective n-side pads NP and p-side pads PP can switch over the connection and disconnection, thereby independently controlling the elements 20 to emit light or not.

Figure 5A:
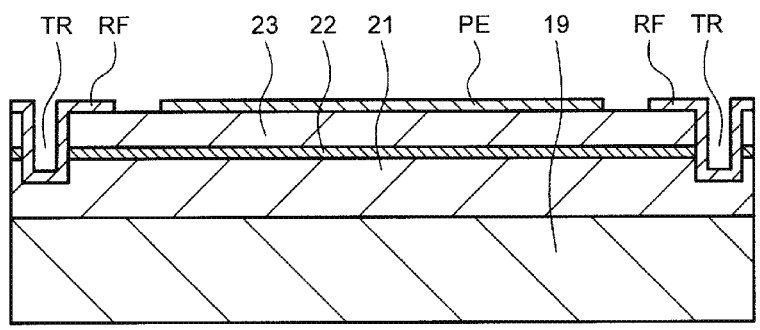
FIGS. 5A, 5B, and 5C are each a cross-sectional view illustrating a method of producing the semiconductor light emitting device of the first exemplary embodiment.
Figure 5B:
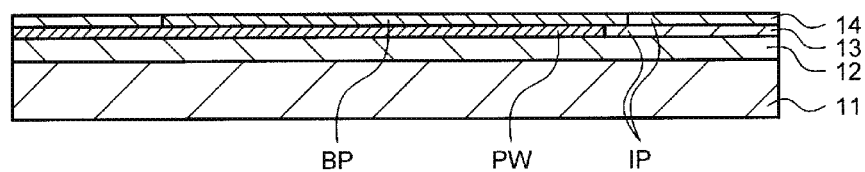
Figure 5C:
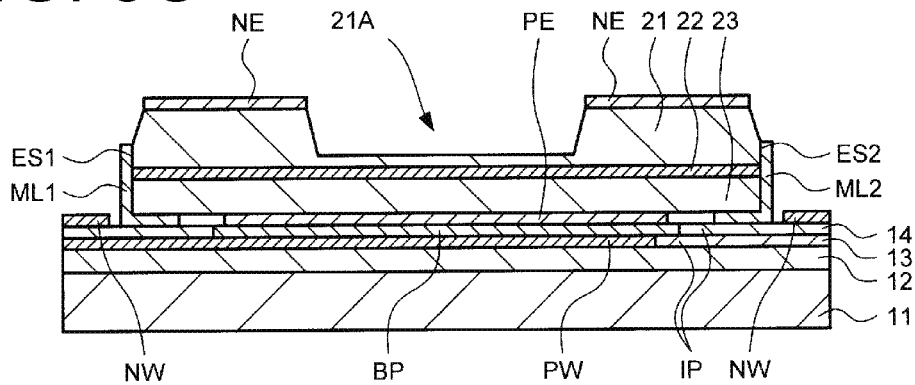
Figure 6A:
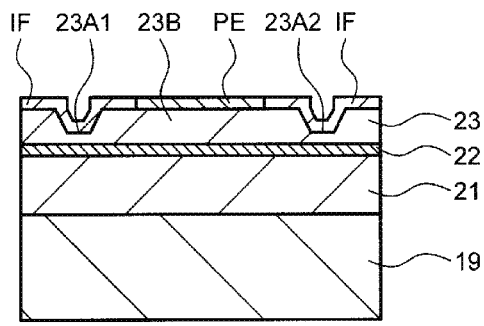
FIGS. 6A, 6B, and 6C are each a cross-sectional view illustrating the method of producing the semiconductor light emitting device of the first exemplary embodiment.
Figure 6B:
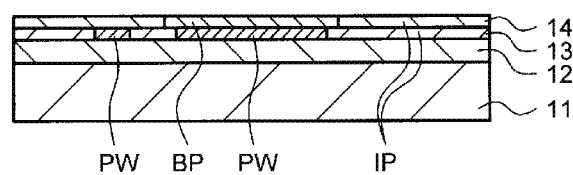
Figure 6C:
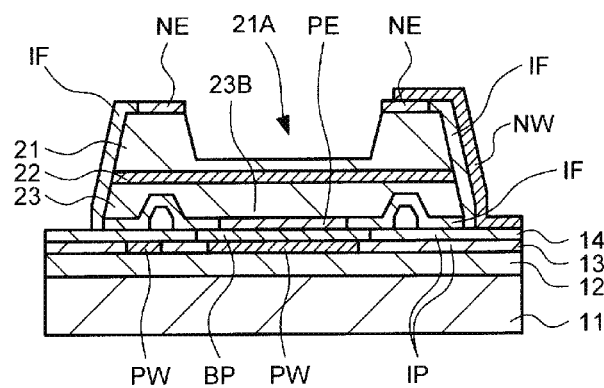

Next, a description will be given of a method of producing the semiconductor light emitting device 10 with reference to FIGS. 5A to 5C and 6A to 6C. Here, FIGS. 5A, 5B, and 5C are each a cross-sectional view illustrating each production process taken along the resonance direction RD of the element 20. Furthermore, FIGS. 6A, 6B, and 6C are each a cross-sectional view illustrating each production process taken along a direction perpendicular to the resonance direction RD of the element 20.

First, the n-type semiconductor layer 12, the active layer 22, and the p-type semiconductor layer 23 to constitute the semiconductor structure layer SL are growth on a growth substrate 19. Here, a sapphire substrate can be used as the growth substrate 19. Then, the first and second grooves 23A1 and 23A2 are formed in the surface of the p-type semiconductor layer 23 to form the ridge portion 23B (see FIG. 6A). Next, the insulating film IF is formed to cover the entire inner wall surfaces of the first and second grooves 23A1 and 23A2, and the p electrode PE is formed on the other surface of the p-type electrode layer 23.

Then, through grooves TR perpendicular to the respective layers are formed in the surface of the p-type semiconductor layer 23 to pass through the p-type semiconductor layer 23 and the active layer 22 and reach the n-type semiconductor layer 21, to thereby form the paired end surfaces ES (the first and second end surfaces ES1 and ES2) of the element 20. On the inner wall surfaces of the through grooves TR, a reflecting layer RF serving as the paired reflecting mirrors ML is formed. In this exemplary embodiment, three pairs of $TaO_2$ and $SiO_2$ are stacked to form the reflecting layer RF (the paired reflecting mirrors ML). Next, the mounting substrate 11 is prepared, and the insulating layer 12 is formed on the mounting substrate 11. Then, the p-side conducting wire layer 13 including the p-side conducting wire PW is formed on the insulating layer 12. Continuously, the bonding layer 14 including the bonding portion BP is formed (see FIGS. 5B and 6B).

Then, the bonding portion BP and the p electrode PE are brought into close contact with each other and heated and pressurized to bond the semiconductor structure layer SL to the substrate 11. The growth substrate 19 is then ground and polished to be removed. Next, the recessed portion 21A to serve as a light extraction portion is formed in the surface of the exposed n-type semiconductor layer 12. On the surface of the n-type semiconductor layer 21 at an area where the recessed portion 21A is not formed, the n electrode NE is formed. Then, the resulting semiconductor structure layer SL is divided (cut) into individual semiconductor layers SL for respective elements 20.

Next, the insulating film IF is formed on the side surface of the semiconductor structure layer SL and also the n-side conducting wires NW are formed (see FIGS. 5C and 6C). Also the n-side pads NP and the p-side pads PP are formed to complete the semiconductor light emitting device 10. When the device 10 is mounted on and fixed to a mounting board, wire bonding of the n-side and p-side pads NP and PP can be performed to connect to a power source. In this manner, the semiconductor light emitting device 10 can be produced.

This exemplary embodiment has been described with reference to a case where the device 10 includes the elements having the same structure. In another exemplary embodiment, the device 10 may have light emitting elements having a different structure from the element 20. Furthermore, the above description has been given of the case where the resonance directions RD of the elements 20 are the same direction when the elements 20 are arranged on the substrate 11 side by side. In another exemplary embodiment, the positions and orientations of the mounted elements 20 are not aligned to each other. The sizes of the elements 20 may be different from each other, and the shapes and sizes of the recessed portions 21A in the respective elements 20 may be different from each other.

Figure 7:
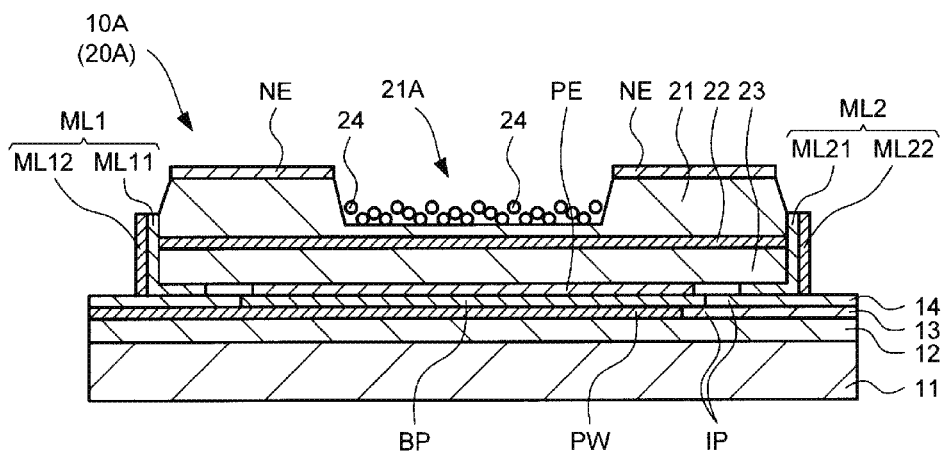
FIG. 7 is a cross-sectional view illustrating a modified example of the semiconductor light emitting device of the first exemplary embodiment.

FIG. 7 is a cross-sectional view illustrating a structure of a semiconductor light emitting device 10A according to a modified example 1 of the first exemplary embodiment. The semiconductor light emitting device 10A including a semiconductor light emitting element 20A can have the same structure as the semiconductor light emitting device 10 except for the structure of the semiconductor light emitting element 20A. FIG. 7 is a cross-sectional view of the semiconductor light emitting element 20A taken along the resonance direction RD. The recessed portion 21A of the semiconductor light emitting element 20A can include a plurality of light scattering members 24 at its bottom portion. When the light scattering members 24 comprise phosphor particles, for example, the bottom portion of the recessed portion 21A can be filled with the phosphor particles. The provision of the light scattering members 24 at the bottom portion of the recessed portion 21A can randomly change the refractive index with respect to the optical field at the bottom portion of the recessed portion 21A. Consequently, the scattering of the resonance light at the bottom portion of the recessed portion 21A can be promoted, thereby enabling to obtain a more amount of the scattered light SLT from the recessed portion 21A (see FIG. 3C).

Part of the scattered light extracted from the bottom portion of the recessed portion 21A can be absorbed by the phosphor particles, and the phosphor particles can wavelength-convert the absorbed light to emit light (fluorescence) having wavelengths different from the original wavelength of the scattered light. As a result, remaining part of the scattered light not absorbed by the phosphor particles and the wavelength converted light from the phosphor particles can be mixed with each other to be emitted from the recessed portion 21A. For example, when the original scattered light is blue and the fluorescent light is yellow, the resulting mixed light to be emitted from the device is white (pseud white).

The wavelength of the original scattered light can be appropriately determined and varied by selection of the semiconductor materials used for production of the light emitting device. The wavelength of fluorescent light can be appropriately determined and varied by selection of the fluorescent material of the particles. Accordingly, desired hue of light to be emitted outside can be designed and obtained by the selection of the semiconductor materials and the fluorescent material. Examples of the fluorescent material may include oxynitride phosphors, such as YAG:Ce and (Ca, Sr, Ba)—SiAlON:Eu, and nitride phosphors, such as $(La, Y)_3Si_6N_{11}$:Ce.

Other examples of the light scattering member 24 may include, in addition to the phosphor particles, members formed from $SiO_2$, $Al_2O_3$, etc. Furthermore, the light scattering member 24 may include different types of scattering members in combination with the phosphor particles. This modified example 1 has been described with the case where the light scattering member 24 is provided at the bottom portion of the recessed portion 21A, which is not limitative. In another modified example, the bottom portion of the recessed portion 21A may be provided with a light scattering structure in place of the light scattering member 24.

In the previous exemplary embodiment, the first reflecting mirror ML1 and the second reflecting mirror ML2 can be provided to the first end surface ES1 and the second end surface ES2 in the paired end surfaces ES of the semiconductor structure layer SL, respectively. The first and second reflecting mirrors ML1 and ML2 can constitute the pair of reflecting mirrors ML opposite to each other, and the resonator can be configured by the paired reflecting mirrors ML. In the modified example 1, on the other hand, the first (second) reflecting mirror ML1 (ML2) can include an optical multi-layered film ML11 (ML21) and a reflecting metal film ML12 (ML22) formed on the optical multi-layered film ML11 (ML21). Examples of materials of the reflecting metal films ML12 and ML22 may include metal materials having high reflectance, such as Ag and Pt.

In this modified example 1, the reflectance at the paired end surfaces ES can be made almost 100%. Thus, the output decrease of light extracted from the recessed portion 21A (the scattered light SLT) can be suppressed. This can almost perfectly prevent the light from being directed from the paired end surfaces ES to the adjacent elements 20 or 20A, and can suppress the occurrence of crosstalk of light.

In the above-described exemplary embodiment, the first conductivity is the p-type conductivity and the second conductivity is the n-type conductivity that is opposite to the p-type conductivity. Of course, the first conductivity may be the n-type conductivity and the second conductivity may be the p-type conductivity. Furthermore, any of the first and second conductivities may be an intrinsic conductivity, i.e., any of the first and second semiconductor layers may be an intrinsic semiconductor layer.

In the above-described exemplary embodiment, the respective light emitting elements can be electrically connected in parallel, but may be electrically connected in series, or may not be electrically connected to each other.

Figure 8A:
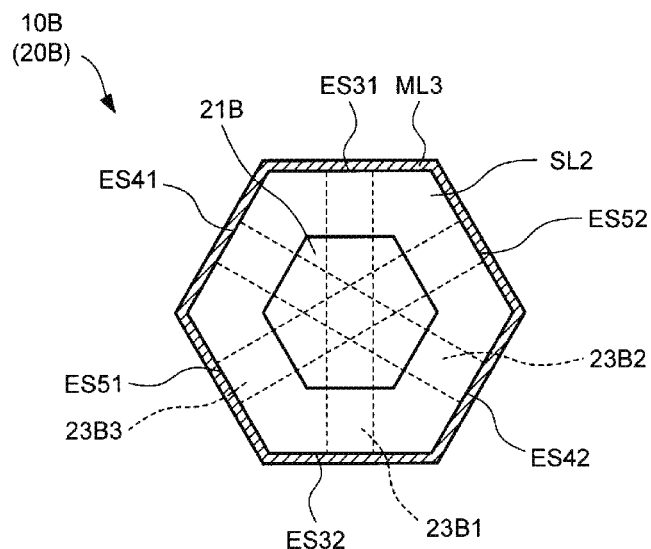
FIGS. 8A and 8B are each a top plan view illustrating another example of the structure of the light emitting elements included in the semiconductor light emitting device of the first exemplary embodiment.
Figure 8B:
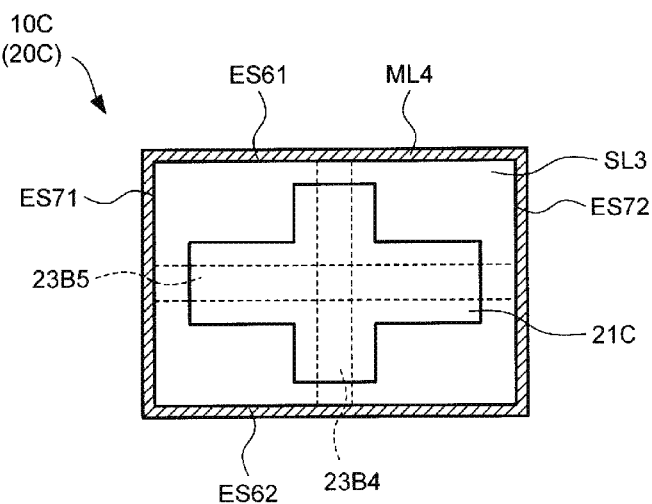

In the above-described exemplary embodiment, the light emitting elements each can have a rectangular shape when viewed from above, which is not limitative. For example, the semiconductor light emitting element may have a triangular or hexagonal shape. As another configuration example of the light emitting element, FIG. 8A illustrates a structure of a light emitting element 20B of a semiconductor light emitting device 10B according to a modified example 2 of the first exemplary embodiment, and FIG. 8B illustrates a structure of a light emitting element 20C of a semiconductor light emitting device 10C according to a modified example 3 of the first exemplary embodiment. FIGS. 8A and 8B are each a top plan view illustrating the respective modified examples of the structures of the semiconductor light emitting elements 20B and 20C when viewed from a direction perpendicular to the substrate 11. The semiconductor light emitting devices 10B and 10C including the semiconductor light emitting elements 20B and 20C, respectively, each can have the same structure as the semiconductor light emitting device 10 except for the structures of the semiconductor light emitting elements 20B and 20C.

As illustrated in FIG. 8A, the light emitting element 20B can have a hexagonal shape when viewed from above. Specifically, the light emitting element 20B can have a semiconductor structure layer SL2 having a hexagonal top plan shape. The semiconductor structure layer SL2 can have a reflecting mirror ML3 formed over the entire side surface thereof. Furthermore, the light emitting element 20B can have three paired end surfaces formed on the side surfaces of the semiconductor structure layer SL2 corresponding to the respective opposite sides of the hexagon. The three paired end surfaces include a pair of end surfaces ES31 and ES32, a pair of end surfaces ES41 and ES42, and a pair of end surfaces ES51 and ES52. The light emitting element 20B can further have three ridge portions 23B1, 23B2, and 23B3 in respective directions perpendicular to the respective end surfaces.

In this modified example 2, the light emitting element 20B can have resonators constituted by the three paired end surfaces and the reflecting mirror ML2 covering the entire side surface. The semiconductor structure layer SL2 of the light emitting element 20B can have a recessed portion 21B having a hexagonal top plan shape. Also in the modified example 2, the recessed portion 21B can function as a light extraction portion of the light emitting element 20B. Incidentally, the shape of the recessed portion 21B can have another top plan shape.

In the modified example 3, as illustrated in FIG. 8B, the light emitting element 20C can have a rectangular shape when viewed from above. Accordingly, the light emitting element 20C can have a semiconductor structure layer SL3 having a rectangular top plan shape. The semiconductor structure layer SL3 can have a reflecting mirror ML4 formed over the entire side surface thereof. Furthermore, the light emitting element 20C can have two paired end surfaces formed on the side surfaces of the semiconductor structure layer SL3 corresponding to the respective opposite sides of the rectangle. The two paired end surfaces include a pair of end surfaces ES61 and ES62, and a pair of end surfaces ES71 and ES72. The light emitting element 20C can further have two ridge portions 23B4 and 23B5 in respective directions perpendicular to the respective end surfaces.

In this modified example 3, the light emitting element 20C can have resonators constituted by the two paired end surfaces and the reflecting mirror ML3 covering the entire side surface. The semiconductor structure layer SL3 of the light emitting element 20C can have a recessed portion 21C having a cross-shaped top plan shape. Also in the modified example 3, the recessed portion 21C can function as a light extraction portion of the light emitting element 20C. Incidentally, also in the modified example 3, the shape of the recessed portion 21C can have another top plan shape.

As described, the light emitting element made in accordance with the principles of the present invention can have a plurality of ridge portions and also have a recessed portion with a various shape, such as a polygonal, circular, etc., functioning as a light extracting portion.

Furthermore, the aforementioned modified examples may be combined with one another. For example, all or part of the element(s) 20, the element(s) 20A, the element(s) 20B, and the element(s) 20C may be formed (mounted) on a single substrate 11. Further, in consideration of suppressing of the formation of dark area in the light emitting area, the respective semiconductor light emitting elements are preferably arranged in a tessellation manner.

Accordingly, the semiconductor light emitting device can be designed in terms of optical system with a high degree of freedom in consideration of the shape where the light is extracted, light intensity distribution, directivity, etc., according to required performances and the like from the viewpoint of the exemplary embodiment and the modified examples. Such semiconductor light emitting devices can be applied to various uses or comply with various requests.

The previous exemplary embodiment and modified examples can include a plurality of semiconductor light emitting elements which each constitute a resonator or resonators and are arranged side by side, and in each of the elements the recessed portion serving as a light extracting portion can be formed in the semiconductor layer. Therefore, the thus obtained semiconductor light emitting device can provide variable light distribution patterns with a compact configuration. Furthermore, the crosstalk between elements can be prevented.

It will be apparent to those skilled in the art that various modifications and variations can be made in the present invention without departing from the spirit or scope of the present invention. Thus, it is intended that the present invention cover the modifications and variations of the present invention provided they come within the scope of the appended claims and their equivalents. All related art references described above are hereby incorporated in their entirety by reference.

What is claimed is:

1. A semiconductor light emitting device comprising:
   a mounting substrate; and
   a plurality of semiconductor light emitting elements mounted on the mounting substrate side by side, each of the semiconductor light emitting elements having a semiconductor structure layer that includes a first semiconductor layer of a first conductivity type, an active layer, and a second semiconductor layer of a second conductivity type opposite to the first conductivity type, which are layered in that order,
   wherein the semiconductor structure layer has a surface that is a surface of the second semiconductor layer and has end surfaces along respective sides thereof opposite to each other, and
   wherein each of the semiconductor light emitting elements has a resonator constituted by the end surfaces of the semiconductor structure layer opposite to each other, and a recessed portion that is recessed from said surface of the second semiconductor layer toward the active layer and that is positioned between the end surfaces of the resonator.

2. The semiconductor light emitting device according to claim 1, further comprising an individual conducting wire for each of the plurality of semiconductor light emitting elements, connected to each of the first semiconductor layers.

3. The semiconductor light emitting device according to claim 1, wherein the recessed portion has a bottom portion where a light scattering structure is provided.

4. The semiconductor light emitting device according to claim 2, wherein the recessed portion has a bottom portion where a light scattering structure is provided.

5. The semiconductor light emitting device according to claim 1, wherein the end surfaces of the semiconductor structure layer opposite to each other are each provided with a reflecting mirror formed from an optical multilayered film.

6. The semiconductor light emitting device according to claim 2, wherein the end surfaces of the semiconductor structure layer opposite to each other are each provided with a reflecting mirror formed from an optical multilayered film.

7. The semiconductor light emitting device according to claim 3, wherein the end surfaces of the semiconductor structure layer opposite to each other are each provided with a reflecting mirror formed from an optical multilayered film.

8. The semiconductor light emitting device according to claim 4, wherein the end surfaces of the semiconductor structure layer opposite to each other are each provided with a reflecting mirror formed from an optical multilayered film.

9. The semiconductor light emitting device according to claim 1, wherein the end surfaces of the semiconductor structure layer opposite to each other are each provided with a reflecting mirror, and wherein the reflecting mirror comprises an optical multilayered film formed on each of the end surfaces opposite to each other, and a reflecting metal film formed on the optical multilayered film.

10. The semiconductor light emitting device according to claim 2, wherein the end surfaces of the semiconductor structure layer opposite to each other are each provided with a reflecting mirror, and wherein the reflecting mirror comprises an optical multilayered film formed on each of the end surfaces opposite to each other, and a reflecting metal film formed on the optical multilayered film.

11. The semiconductor light emitting device according to claim 3, wherein the end surfaces of the semiconductor structure layer opposite to each other are each provided with a reflecting mirror, and wherein the reflecting mirror comprises an optical multilayered film formed on each of the end surfaces opposite to each other, and a reflecting metal film formed on the optical multilayered film.

12. The semiconductor light emitting device according to claim 4, wherein the end surfaces of the semiconductor structure layer opposite to each other are each provided with a reflecting mirror, and wherein the reflecting mirror comprises an optical multilayered film formed on each of the end surfaces opposite to each other, and a reflecting metal film formed on the optical multilayered film.

13. The semiconductor light emitting device according to claim 3, wherein the light scattering structure includes phosphor particles provided at the bottom portion of the recessed portion.

14. The semiconductor light emitting device according to claim 4, wherein the light scattering structure includes phosphor particles provided at the bottom portion of the recessed portion.

15. The semiconductor light emitting device according to claim 7, wherein the light scattering structure includes phosphor particles provided at the bottom portion of the recessed portion.

16. The semiconductor light emitting device according to claim 8, wherein the light scattering structure includes phosphor particles provided at the bottom portion of the recessed portion.

17. The semiconductor light emitting device according to claim 11, wherein the light scattering structure includes phosphor particles provided at the bottom portion of the recessed portion.

18. The semiconductor light emitting device according to claim 12, wherein the light scattering structure includes phosphor particles provided at the bottom portion of the recessed portion.

* * * * *